(12) United States Patent
Harada et al.

(10) Patent No.: US 8,412,032 B2
(45) Date of Patent: Apr. 2, 2013

(54) A/D CONVERSION CIRCUIT, SIGNAL PROCESSING CIRCUIT, AND SHAKE DETECTION DEVICE

(75) Inventors: Yasunari Harada, Ebina (JP); Takamoto Watanabe, Nagoya (JP)

(73) Assignees: Olympus Corporation, Tokyo (JP); Denso Corporation, Aichi (JP)

( * ) Notice: Subject to any disclaimer, the term of this patent is extended or adjusted under 35 U.S.C. 154(b) by 0 days.

(21) Appl. No.: 13/277,602

(22) Filed: Oct. 20, 2011

(65) Prior Publication Data

US 2012/0039588 A1    Feb. 16, 2012

Related U.S. Application Data

(63) Continuation of application No. PCT/JP2010/002853, filed on Apr. 20, 2010.

(30) Foreign Application Priority Data

Apr. 23, 2009  (JP) ................................ 2009-105236

(51) Int. Cl.
G03B 17/00 (2006.01)
H04N 5/228 (2006.01)
H03M 1/12 (2006.01)
(52) U.S. Cl. ........ 396/52; 348/208.99; 396/55; 341/155
(58) Field of Classification Search ............... 396/52–55; 348/208.99, 208.1, 208.2
See application file for complete search history.

(56) References Cited

U.S. PATENT DOCUMENTS

| 4,817,448 | A | * | 4/1989 | Hargarten et al. ........ 73/861.356 |
| 5,579,247 | A | | 11/1996 | Kerth et al. |
| 7,227,490 | B2 | * | 6/2007 | Kawahito ..................... 341/155 |
| 2008/0309542 | A1 | | 12/2008 | Tanizawa |

FOREIGN PATENT DOCUMENTS

| JP | 5-093742 A | 4/1993 |
| JP | 3064644 B2 | 7/2000 |
| JP | 3876483 B2 | 1/2007 |
| JP | 2008-131298 A | 6/2008 |
| JP | 2008-312185 A | 12/2008 |

OTHER PUBLICATIONS

International Search Report of PCT/JP2010/002853, mailing date May 25, 2010.

* cited by examiner

*Primary Examiner* — Christopher Mahoney
(74) *Attorney, Agent, or Firm* — Westerman, Hattori, Daniels & Adrian, LLP

(57) ABSTRACT

The A/D conversion circuit may include A/D conversion units each of which converts input analog signals into digital signals, a switch unit that receives a first and second analog signals among the analog signals, the switch unit alternately switching output destinations of the first and second analog signals input in the same period to the A/D conversion units in each sampling cycle of the A/D conversion units; and an arithmetic unit that performs a differential operation between a result of addition of the digital signals output from the A/D conversion units to which the first analog signal is input and a result of addition of the digital signals output from the A/D conversion units which the second analog signal is input, the arithmetic unit outputting a third digital signal corresponding to a result of the differential operation.

10 Claims, 7 Drawing Sheets

A/D CONVERSION CIRCUIT, SIGNAL PROCESSING CIRCUIT, AND SHAKE DETECTION DEVICE

CROSS REFERENCE TO RELATED APPLICATIONS

This application is a continuation application based on a PCT Patent Application No. PCT/JP2010/002853, filed Apr. 20, 2010, whose priority is claimed on Japanese Patent Application No. 2009-105236, filed Apr. 23, 2009, the entire content of which are hereby incorporated by reference.

BACKGROUND OF THE INVENTION

1. Field of the Invention

The present invention relates to an analog-to-digital (A/D) conversion circuit, which converts an analog signal into a digital signal, and a signal processing circuit and a shake detection device using the same.

2. Description of the Related Art

Japanese Patent No. 3064644 discloses an A/D conversion circuit, which inputs a pulse signal into a pulse transit circuit in which a plurality of delay units are connected in series to delay the input pulse signal by a delay time corresponding to an analog signal and output the delayed pulse signal, latches an output signal from each delay unit at a predetermined timing, and generates a digital signal indicating an arrival position of the pulse signal within the pulse transit circuit based on the level of each output signal latched. Japanese Patent No. 3876483 discloses a pressure sensor apparatus, which processes a plurality of analog signals having a correlation using the A/D conversion circuit.

An analog signal input to the pressure sensor apparatus includes a different noise component depending on a timing when an A/D conversion is performed. Thus, if a plurality of analog signals having a correlation are intended to be accurately A/D-converted, it is preferable to simultaneously A/D-convert the plurality of analog signals using A/D conversion circuits of which the number is equal to or greater than the number of analog signals. The A/D conversion accuracy of the above-described A/D conversion circuits largely depends on the performance of the pulse transit circuit. However, the pulse transit circuit includes a negative AND circuit (NAND), inverters (INVs), and the like. Thus, A/D conversion errors easily occur due to individual differences of the A/D conversion circuits.

Accordingly, the above-described pressure sensor apparatus, does not A/D-convert a plurality of analog signals having a correlation during the same period. Thus, it is difficult to reduce the influence of noise components overlapping analog signals during the same period. When A/D conversion circuits of which the number is equal to or greater than the number of analog signals having a correlation are provided and the analog signals are A/D-converted during the same period, it is difficult to reduce the influence of A/D conversion errors due to individual differences of the A/D conversion circuits.

SUMMARY

The present invention provides an A/D conversion circuit, a signal processing circuit, and a shake detection device capable of accurately A/D-converting a plurality of analog signals having a correlation.

An analog-to-digital (A/D) conversion circuit may receive a plurality of analog signals and output digital signals corresponding to the analog signals. The A/D conversion circuit may include: a plurality of A/D conversion units each of which converts input analog signals into digital signals; a switch unit that receives a first analog signal and a second analog signal among the plurality of analog signals, the switch unit alternately switching output destinations of the first analog signal and the second analog signal input in the same period to the plurality of A/D conversion units in each sampling cycle of the plurality of A/D conversion units; and an arithmetic unit that performs a differential operation between a result of addition of the digital signals output from the plurality of A/D conversion units to which the first analog signal is input and a result of addition of the digital signals output from the plurality of A/D conversion units to which the second analog signal is input, the arithmetic unit outputting a third digital signal corresponding to a result of the differential operation.

An analog-to-digital (A/D) conversion circuit may receive a plurality of analog signals and output digital signals corresponding to the analog signals. The A/D conversion circuit may include: a plurality of A/D conversion units each of which converts input analog signals into digital signals; a switch unit that receives a first analog signal and a second analog signal among the plurality of analog signals, the switch unit alternately switching output destinations of the first analog signal and the second analog signal input in the same period to the plurality of A/D conversion units in each sampling cycle of the plurality of A/D conversion units; and an arithmetic unit that performs a division operation between a result of addition of the digital signals output from the plurality of A/D conversion units to which the first analog signal is input and a result of addition of the digital signals output from the plurality of A/D conversion units to which the second analog signal is input, the arithmetic unit outputting a third digital signal corresponding to a result of the division operation.

The first analog signal and the second analog signal may be output from the same sensor.

The number of the plurality of A/D conversion units may be greater than the number of the plurality of analog signals.

The A/D conversion unit may include: a pulse transit circuit in which a plurality of delay units are connected in series to delay an input pulse signal by a delay time corresponding to the analog signals and output the delayed pulse signal; and a latch circuit that latches an output signal from each delay unit constituting the pulse transit circuit at a predetermined timing after the pulse signal is input into the pulse transit circuit, the latch circuit generating the digital signals indicating an arrival position of the pulse signal within the pulse transit circuit based on a level of each output signal that has been latched.

A signal processing circuit may include: a sensor unit that detects physical amounts and outputs a plurality of analog signals indicating the detected physical amounts; the A/D conversion circuit according to claim 1 to which the plurality of analog signals output from the sensor unit are input; and a digital signal processing unit that performs predetermined signal processing based on the digital signal output from the A/D conversion circuit.

A shake detection device may include: a shake detection unit that detects a shake of an imaging device and outputs a plurality of analog signals including a signal indicating an amount of the detected shake; the A/D conversion circuit according to claim 1 to which the plurality of analog signals output from the shake detection unit are input; a position signal generation unit that generates a position signal indicating a position where an imaging unit or a lens unit in the imaging device is driven; and a drive signal generation unit that generates a signal for driving the imaging unit or the lens unit based on a deviation between the digital signal output from the A/D conversion circuit and the position signal output from the position signal generation unit.

According to the present invention, the first and second analog signals input in the same period are A/D-converted by different A/D conversion units. The first and second analog signals are A/D-converted by a plurality of A/D conversion units, respectively. Thus, it is possible to reduce the influence of noise components overlapping analog signals during the same period or the influence of an A/D conversion error due to an individual difference of the A/D conversion circuit in the third digital signal corresponding to a result of a differential operation or a division operation performed by the arithmetic unit. Accordingly, it is possible to accurately A/D-convert a plurality of analog signals having a correlation.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

First Preferred Embodiment

Figure 1:
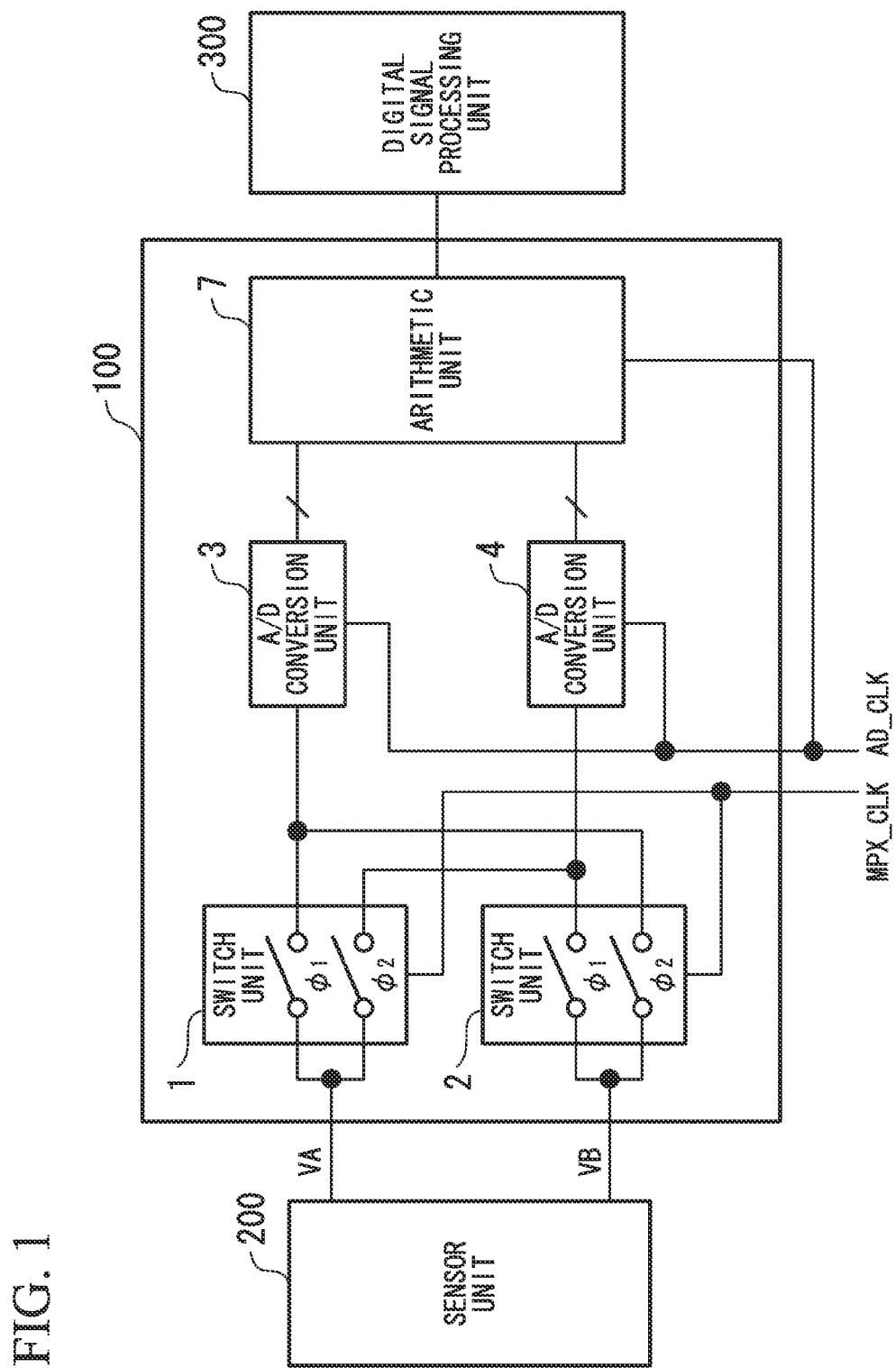
FIG. 1 is a block diagram illustrating a configuration of a signal processing circuit including an A/D conversion circuit in accordance with the first preferred embodiment of the present invention.

First, the first preferred embodiment of the present invention will be described. FIG. 1 is a block diagram illustrating a configuration of a signal processing circuit including an A/D conversion circuit in accordance with the first preferred embodiment of the present invention. The signal processing circuit shown in FIG. 1 includes an A/D conversion circuit 100, a sensor unit 200, and a digital signal processing unit 300. The A/D conversion circuit 100 includes switch units 1 and 2, A/D conversion units 3 and 4, and an arithmetic unit 7.

A plurality of analog signals (VA and VB signals) output from the sensor unit 200 are input to the switch units 1 and 2. Noise included in the VA and VB signals has a correlation. Based on a control signal MPX_CLK, the switch units 1 and 2 alternately switch output destinations of the VA and VB signals input in the same period to the A/D conversion units 3 and 4 in each sampling cycle of the A/D conversion units 3 and 4. The switch unit 1 switches the output destination of the VA signal, and the switch unit 2 switches the output destination of the VB signal.

The A/D conversion units 3 and 4 A/D-convert the VA and VB signals output from the switch units 1 and 2 based on a control signal AD_CLK, and generate digital signals. The arithmetic unit 7 performs an arithmetic operation on the digital signals output from the A/D conversion units 3 and 4 based on the control signal AD_CLK, and outputs an arithmetic operation result to the subsequent-stage digital signal processing unit 300. More specifically, the arithmetic unit 7 performs a differential operation or a division operation between a result of addition of the digital signals output from the A/D conversion units 3 and 4 to which the VA signal is input and a result of addition of the digital signals output from the A/D conversion units 3 and 4 to which the VB signal is input. Details of the arithmetic operation performed by the arithmetic unit 7 will be described later.

The sensor unit 200 detects physical amounts and outputs VA and VB signals indicating the detected physical amounts. The digital signal processing unit 300 performs predetermined signal processing based on a digital signal output from the A/D conversion circuit 100.

Figure 2:
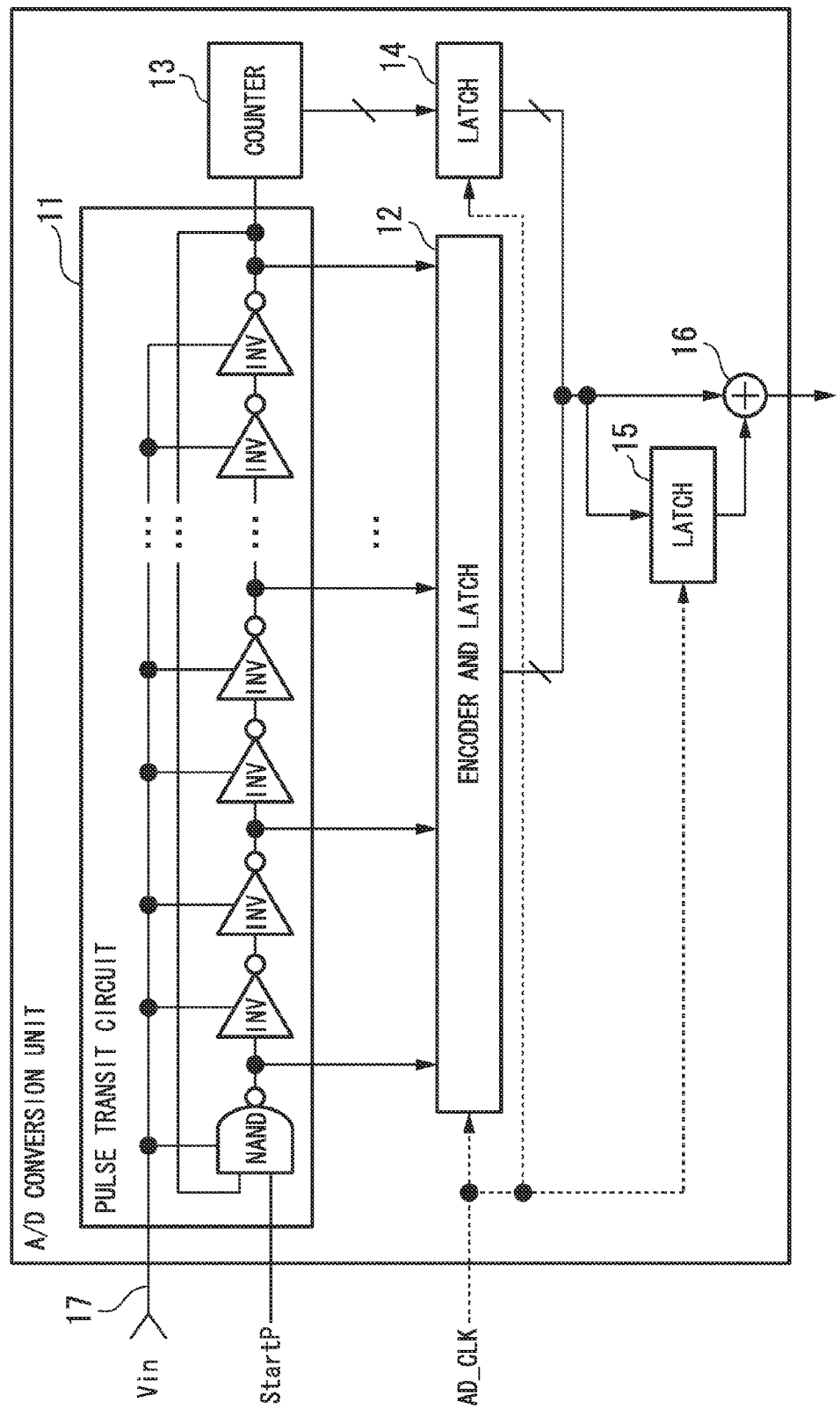
FIG. 2 is a block diagram illustrating a configuration of an A/D conversion units included in the A/D conversion circuit in accordance with the first preferred embodiment of the present invention.

FIG. 2 is a block diagram illustrating a configuration of the A/D conversion units 3 and 4. Each of the A/D conversion units 3 and 4 includes a pulse transit circuit 11, an encoder and latch 12, a counter 13, latches 14 and 15, and an arithmetic operator 16.

The pulse transit circuit 11 is configured by connecting a NAND circuit serving as an inverting circuit for start-up to be operated by receiving a pulse signal StartP though one input terminal and a plurality of INV circuits serving as inverting circuits in a ring shape. The NAND circuit and the plurality of INV circuits constituting the pulse transit circuit 11 delay the pulse signal StartP by a delay time corresponding to an analog signal input from a power supply line Vin (17), and output the delayed pulse signal StartP.

The encoder and latch 12 encodes and latches signals, based on levels of the signals output from the NAND circuit and the plurality of INV circuits constituting the pulse transit circuit 11 in synchronization with the control signal AD_CLK. A signal output by the encoder and latch 12 indicates an arrival position of the pulse signal StartP within the pulse transit circuit 11. The counter 13 measures a signal output from a last-stage INV circuit of the pulse transit circuit 11. A signal output by the counter 13 indicates the number of circulations of the pulse signal StartP within the pulse transit circuit 11.

The latch 14 latches the signal output from the counter 13 in synchronization with the control signal AD_CLK. In synchronization with the control signal AD_CLK, the latch 15 adds signals output from the encoder and latch 12 and the latch 14 and latches an addition result. The arithmetic operator 16 calculates a difference between a previous signal output from the latch 15 and a current signal based on the outputs of the encoder and latch 12 and the latch 14, and outputs the calculated difference to the arithmetic unit 7.

The switch units 1 and 2 are connected to the power supply line Vin (17) for supplying power to the NAND circuit and the INV circuits within the pulse transit circuit 11.

First Operation Example

Figure 3:
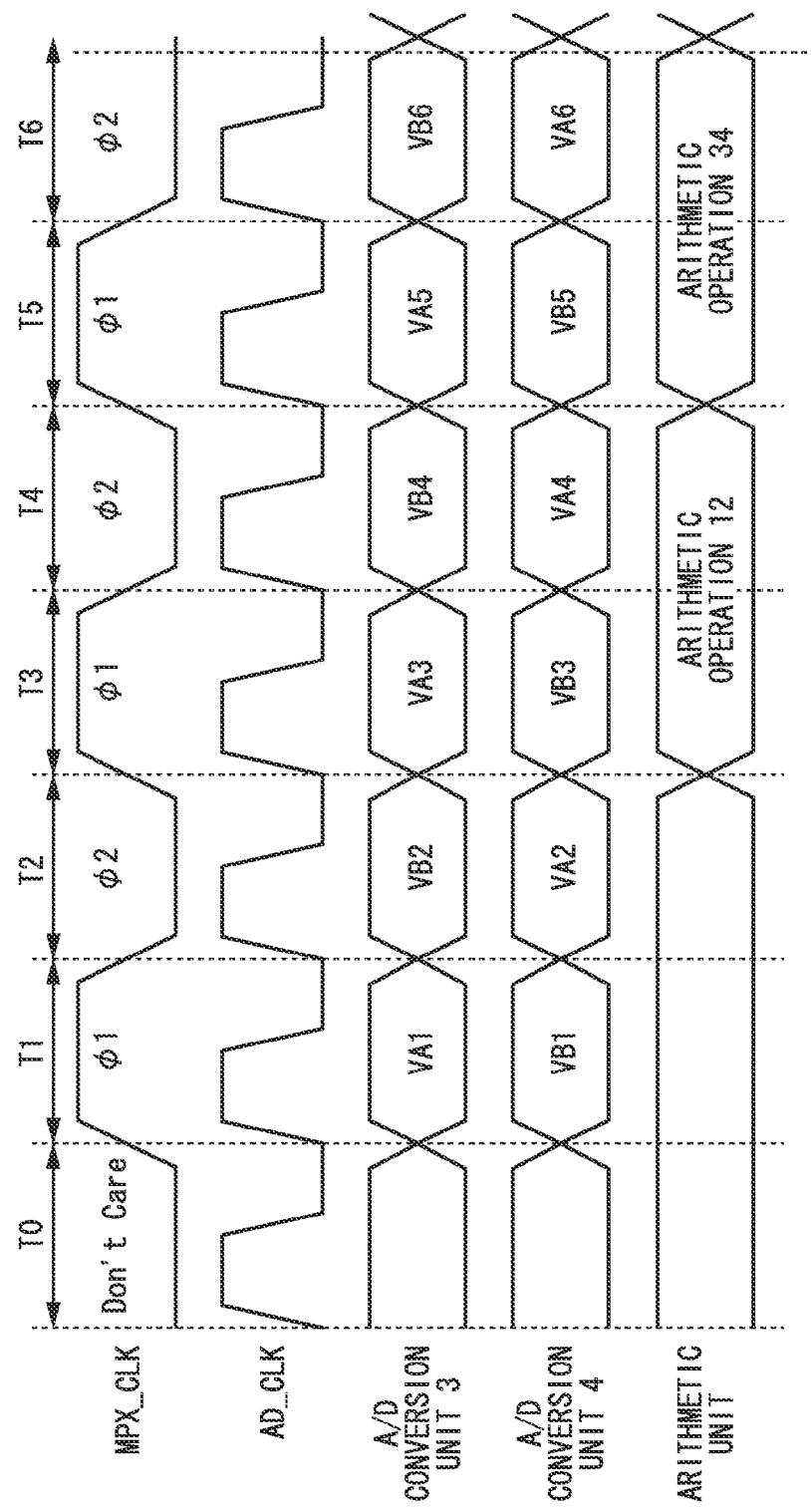
FIG. 3 is a timing chart illustrating an operation of the A/D conversion circuit in accordance with the first preferred embodiment of the present invention.

Next, the first operation example (differential operation), which is a feature of the A/D conversion circuit 100 configured as described above, will be described in conjunction with a timing chart. FIG. 3 is a timing chart illustrating an operation of the A/D conversion circuit 100 in accordance with the first preferred embodiment of the present invention.

The first operation example is based on the following points. If the VA signal is a desired sensor output, a noise component is included in the VA signal along with a physical amount to be fundamentally detected. It is possible to reduce noise by calculating a difference between the VB signal, including a noise component correlated with a noise component included in the VA signal, and the VA signal. In the first operation example, it is possible to further reduce noise by calculating a difference between results obtained by adding A/D conversion results of a plurality of A/D conversion units without calculating a mere difference between two types of signals.

Hereinafter, an operation of the first operation example will be described. When a period T0 is reached, the pulse signal StartP supplied to the A/D conversion units 3 and 4 varies from an "L" level to an "H" level, and circulates within the NAND circuit (NAND) and the plurality of INVs configured in the ring shape. The counter 13 counts the number of circulations in which the pulse signal StartP varying with levels of signals Vin (17) supplied from the switch unit 1 and 2 and a cycle of the control signal AD_CLK circulates in the NAND and the INVs within the pulse transit circuit 11, and outputs the counted number of circulations as binary digital data. The encoder and latch 12 detects a position where the pulse signal StartP varying with the levels of the signals Vin (17) supplied from the switch units 1 and 2 and the cycle of the control signal AD_CLK circulates in the NAND and the INVs within the pulse transit circuit 11, and output the detected position as binary digital data.

The latch 14 latches the digital data output from the counter 13. The latch 15 generates binary digital data corresponding to the signal levels supplied from the switch units 1 and 2 in the cycle of the control signal AD_CLK by receiving the digital data from the latch 14 as higher bits and the digital data from the encoder and latch 12 as lower bits and adding the received digital data.

The arithmetic operator 16 calculates a difference between digital data after the latch operation of the latch 15 and digital data before the latch operation of the latch 15, and outputs the calculated difference to the subsequent-stage digital signal processing unit 300. Until the pulse signal StartP varies from the "H" level to the "L" level, the A/D conversion units 3 and 4 periodically output digital data corresponding to the levels of the signals Vin (17) supplied from the switch units 1 and 2 in the cycle of the control signal AD_CLK.

When a period T1 is reached, the control signal MPX_CLK has the "H" level, the switch unit 1 supplies the VA signal from the sensor unit 200 to the A/D conversion unit 3, and the switch unit 2 supplies the VB signal from the sensor unit 200 to the A/D conversion unit 4. The A/D conversion unit 3 A/D-converts the VA signal selected by the switch unit 1 based on a cycle set by the control signal AD_CLK. The A/D conversion unit 4 A/D-converts the VB signal selected by the switch unit 2 based on the cycle set by the control signal AD_CLK.

When a period T2 is reached, the control signal MPX_CLK has the "L" level, the switch unit 2 supplies the VB signal from the sensor unit 200 to the A/D conversion unit 3, and the switch unit 1 supplies the VA signal from the sensor unit 200 to the A/D conversion unit 4. The A/D conversion unit 3 A/D-converts the VB signal selected by the switch unit 2 based on the cycle set by the control signal AD_CLK. The A/D conversion unit 4 A/D-converts the VA signal selected by the switch unit 1 based on the cycle set by the control signal AD_CLK.

Here, one cycle of the control signal MPX_CLK in each period has substantially the same period as two cycles of the control signal AD_CLK unless otherwise noted.

When a period T3 is reached, as in the period T1, the control signal MPX_CLK has the "H" level, the switch unit 1 supplies the VA signal from the sensor unit 200 to the A/D conversion unit 3, and the switch unit 2 supplies the VB signal from the sensor unit 200 to the A/D conversion unit 4. The A/D conversion unit 3 A/D-converts the VA signal selected by the switch unit 1 based on the cycle set by the control signal AD_CLK. The A/D conversion unit 4 A/D-converts the VB signal selected by the switch unit 2 based on the cycle set by the control signal AD_CLK. Furthermore, the arithmetic unit 7 starts a predetermined arithmetic operation using results after the A/D conversion units 3 and 4 A/D-convert the VA and VB signals during the periods T1 and T2.

When a period T4 is reached, as in the period T2, the control signal MPX_CLK has the "L" level, the switch unit 2 supplies the VB signal from the sensor unit 200 to the A/D conversion unit 3, and the switch unit 1 supplies the VA signal from the sensor unit 200 to the A/D conversion unit 4. The A/D conversion unit 3 A/D-converts the VB signal selected by the switch unit 2 based on the cycle see by the control signal AD_CLK. The A/D conversion unit 4 A/D-converts the VA signal selected by the switch unit 1 based on the cycle set by the control signal AD_CLK. Furthermore, the arithmetic unit 7 ends the predetermined arithmetic operation using the results after the A/D conversion units 3 and 4 A/D-convert the VA and VB signals during periods the T1 and T2.

Here, the arithmetic unit 7 performs the following arithmetic operation to amplify a difference signal between the VA and VB signals A/D-converted during the periods T1 and T2 at any magnification ratio. Equation (1) indicates an arithmetic operation to be performed by the arithmetic unit 7, and Equation (2) is a modified equation of Equation (1).

$$V_{OUT12} = \alpha[(VA1 + \text{Noise1} + \text{Error1}) + (VA2 + \text{Noise2} + \text{Error2})] - \\ \alpha[(VB1 + \text{Noise1} + \text{Error2}) + (VB2 + \text{Noise2} + \text{Error1})] + \beta \quad (1)$$

$$V_{OUT12} \cong \alpha[(VA1 + VA2) - (VB1 + VB2)] + \beta \quad (2)$$

The meanings of the symbols in Equations (1) and (2) are as follows.

$V_{OUT12}$: Arithmetic operation result of the arithmetic unit 7 during the periods T1 and T2

VA1: VA signal of the sensor unit 200 in the period T1
VB1: VB signal of the sensor unit 200 in the period T1.
VA2: VA signal of the sensor unit 200 in the period T2
VB2: VB signal of the sensor unit 200 in the period T2
$\alpha$: Amplification factor
$\beta$: Reference signal to be added to the arithmetic operation result
Noise1: Noise component overlapping the sensor unit 200 in the period T1

Noise2: Noise component overlapping the sensor unit 200 in the period T2

Error1: A/D conversion error of the A/D conversion unit 3

Error2: A/D conversion error of the A/D conversion unit 4

It is possible to cancel the influence of the noise components overlapping the sensor unit 200 or the influence of the A/D conversion errors of the A/D conversion units 3 and 4 during the periods T1 and T2 from the above-described arithmetic operation result.

When a period T5 is reached, as in the periods T1 and T3, the control signal MPX_CLK has the "H" level, the switch unit 1 supplies the VA signal from the sensor unit 200 to the A/D conversion unit 3, and the switch unit 2 supplies the VB signal from the sensor unit 200 to the A/D conversion unit 4. The A/D conversion unit 3 A/D-converts the VA signal selected by the switch unit 1 based on the cycle set by the control signal AD_CLK. The A/D conversion unit 4 A/D-converts the VB signal selected by the switch unit 2 based on the cycle set by the control signal AD_CLK. Furthermore, the arithmetic unit 7 starts a predetermined arithmetic operation using results after the A/D conversion units 3 and 4 A/D-convert the VA and VB signals during the periods T3 and T4.

When a period T6 is reached, as in the periods T2 and T4, the control signal MPX_CLK has the "L" level, the switch unit 2 supplies the VB signal from the sensor unit 200 to the A/D conversion unit 3, and the switch unit 1 supplies the VA signal from the sensor unit 200 to the A/D conversion unit 4. The A/D conversion unit 3 A/D-converts the VB signal selected by the switch unit 2 based on the cycle set by the control signal AD_CLK. The A/D conversion unit 4 A/D-converts the VA signal selected by the switch unit 1 based on the cycle set by the control signal AD_CLK. Furthermore, the arithmetic unit 7 ends the predetermined arithmetic operation using the results after the A/D conversion units 3 and 4 A/D-convert the VA and VB signals during the periods T3 and T4.

Here, the arithmetic unit 7 performs the following arithmetic operation to amplify a difference signal between the VA and VB signals A/D-converted during the periods T3 and T4 at any magnification ratio. Equation (3) indicates an arithmetic operation to be performed by the arithmetic unit 7, and Equation (4) is a modified equation of Equation (3).

$$V_{OUT34} = \alpha[(VA3 + \text{Noise3} + \text{Error3}) + (VA4 + \text{Noise4} + \text{Error4})] - \alpha[(VB4 + \text{Noise3} + \text{Error4}) + (VB4 + \text{Noise4} + \text{Error3})] + \beta \quad (3)$$

$$V_{OUT34} \cong \alpha[(VA3 + VA4) - (VB3 + VB4)] + \beta \quad (4)$$

The meanings of the symbols in Equations (3) and (4) are as follows.

$V_{OUT34}$: Arithmetic operation result of the arithmetic unit 7 during the periods T3 and T4

VA3: VA signal of the sensor unit 200 in the period T3

VB3: VB signal of the sensor unit 200 in the period T3

VA4: VA signal of the sensor unit 200 in the period T4

VB4: VB signal of the sensor unit 200 in the period T4

α: Amplification factor

β: Reference signal to, be added to the arithmetic operation result

Noise3: Noise component overlapping the sensor unit 200 in the period T3

Noise4: Noise component overlapping the sensor unit 200 in the period T4

Error3: A/D conversion error of the A/D conversion unit 3

Error4: A/D conversion error of the A/D conversion unit 4

It is possible to cancel the influence of the noise components overlapping the sensor unit 200 or the influence of the A/D conversion errors of the A/D conversion units 3 and 4 during the periods T3 and T4 from the above-described arithmetic operation result.

Because the same operation from a period T7 as in periods the T3 and T4 or the periods T5 and T6 is iterated until the pulse signal StartP supplied to the A/D conversion units 3 and 4 varies from the "H" level to the "L" level, description thereof is omitted.

Second Operation Example

Next, a difference of the second operation example (division operation) from the first operation example will be described, which is a feature in the A/D conversion circuit 100 configured as described above. In the second operation example (division operation), an arithmetic operation in the periods T3 and T4 is as follows. Equation (5) indicates an arithmetic operation to be performed by the arithmetic unit 7, and Equation (6) is a modified equation of Equation (5).

$$V_{OUT12} = [ \quad (5)$$
$$\alpha\{(VA1 + \text{Noise1} + \text{Error1}) + (VA2 + \text{Noise2} + \text{Error2})\} + \beta] +$$
$$[\alpha\{(VB1 + \text{Noise1} + \text{Error2}) + (VB2 + \text{Noise2} + \text{Error1})\} + \beta]$$

$$V_{OUT12} = [\alpha \quad (6)$$
$$\{(VA1 + VA2) + (\text{Noise1} + \text{Error2}) + (\text{Error1} + \text{Error2})\} + \beta] +$$
$$[\alpha\{(VB1 + VB2) + (\text{Noise1} + \text{Noise2})(\text{Error1} + \text{Error2})\} + \beta]$$

The meanings of the symbols in Equations (5) and (6) are as follows.

$V_{OUT12}$: Arithmetic operation result of the arithmetic unit 7 during the periods T1 and T2

VA1: VA signal of the sensor unit 200 in the period T1

VB1: VB signal of the sensor unit 200 in the period T1

VA2: VA signal of the sensor unit 200 in the period T2

VB2: VB signal of the sensor unit 200 in the period T2

α: Amplification factor

β: Reference signal to be added to the arithmetic operation result

Noise1: Noise component overlapping the sensor unit 200 in the period T1

Noise2: Noise component overlapping the sensor unit 200 in the period T2

Error1: A/D conversion error of the A/D conversion unit 3

Error2: A/D conversion error of the A/D conversion unit 4

In the second operation example (division operation), an arithmetic operation in the periods T5 and T6 is as follows. Equation (7) indicates an arithmetic operation to be performed by the arithmetic unit 7, and Equation (8) is a modified equation of Equation (7).

$$V_{OUT34} = [ \quad (7)$$
$$\alpha\{(VA3 + \text{Noise3} + \text{Error3}) + (VA4 + \text{Noise4} + \text{Error4})\} + \beta] +$$
$$[\alpha\{(VB3 + \text{Noise3} + \text{Error4}) + (VB4 + \text{Noise4} + \text{Error3})\} + \beta]$$

$$V_{OUT34} = [\alpha \quad (8)$$
$$\{(VA3 + VA4) + (\text{Noise3} + \text{Error4}) + (\text{Error3} + \text{Error4})\} + \beta] +$$
$$[\alpha\{(VB3 + VB4) + (\text{Noise3} + \text{Noise4}) + (\text{Error3} + \text{Error4})\} + \beta]$$

The meanings of the symbols in Equations (7) and (8) are as follows.

$V_{OUT34}$: Arithmetic operation result of the arithmetic unit 7 during the periods T3 and T4

VA3: VA signal of the sensor unit 200 in the period T3
VB3: VB signal of the sensor unit 200 in the period T3
VA4: VA signal of the sensor unit 200 in the period T4
VB4: VB signal of the sensor unit 200 in the period T4
α: Amplification factor
β: Reference signal to be added to the arithmetic operation result
Noise3: Noise component overlapping the sensor unit 200 in the period T3
Noise4: Noise component overlapping the sensor unit 200 in the period T4
Error3: A/D conversion error of the A/D conversion unit 3
Error4: A/D conversion error of the A/D conversion unit 4

As described above, a numerator of Equation (6) or (8) includes the signal components VA (VA1+VA2 or VA3+VA4), the unnecessary noise components Noise1+Noise2+Error1+Error2 or Noise3+Noise4+Error3+Error4, and the reference signal β to be added. A denominator of Equation (6) or (8) includes the signal components VB (VB1+VB2 or VB3+VB4), the unnecessary noise components Noise1+Noise2+Error1+Error2 or Noise3+Noise4+Error3+Error4, and the reference signal β to be added. That is, the unnecessary noise component and the reference signal to be added are identical.

Accordingly, a division operation result of Equation (6) or (8) generally becomes a relative variation between the signal component VA and the signal component VB, and comparative rate information between the signal component VA and the signal component VB in which the influence of the unnecessary noise component and the reference signal to be added is reduced can be obtained as an A/D conversion result. For example, it is possible to accurately obtain a relative variation of a sensor signal to a reference signal by designating the signal component VA as the sensor signal and designating the signal component VB as the reference signal.

In addition, it is also possible to simultaneously execute a temperature correction for an A/D converter because the unnecessary noise component can also be shared in the numerator and the denominator of Equation (6) or (8) in terms of a change in a resolution of the A/D converter due to a temperature variation. Furthermore, it is possible to set Noise1 and Noise2 of Equation (6) and Noise3 and Noise4 of Equation (8) to be substantially equal to each other by shortening the cycle set by the control signal. AD_CLK at an input signal frequency to the A/D converter, and eliminate low-frequency noise at the input signal frequency.

According to this preferred embodiment as described above, the arithmetic unit 7 performs a differential operation or a division operation, thereby reducing the influence of the noise components overlapping the VA and VB signals during the same period or the influence of A/D conversion errors due to individual differences of the A/D conversion units 3 and 4. Also, the arithmetic unit 7 performs the division operation, thereby canceling a resolution change of the A/D converter and eliminating low-frequency noise. Accordingly, it is possible to improve an A/D conversion accuracy when the VA and VB signals having a correlation are converted into digital signals.

Although the sensor unit 200 is not particularly specified in this preferred embodiment, the same effect as described above can be obtained, for example, as long as it is a sensor capable of alternately outputting a plurality of analog signals having low output signal amplitudes and a correlation to A/D conversion units in each sampling cycle, without being particularly limited.

Second Preferred Embodiment

Figure 4:
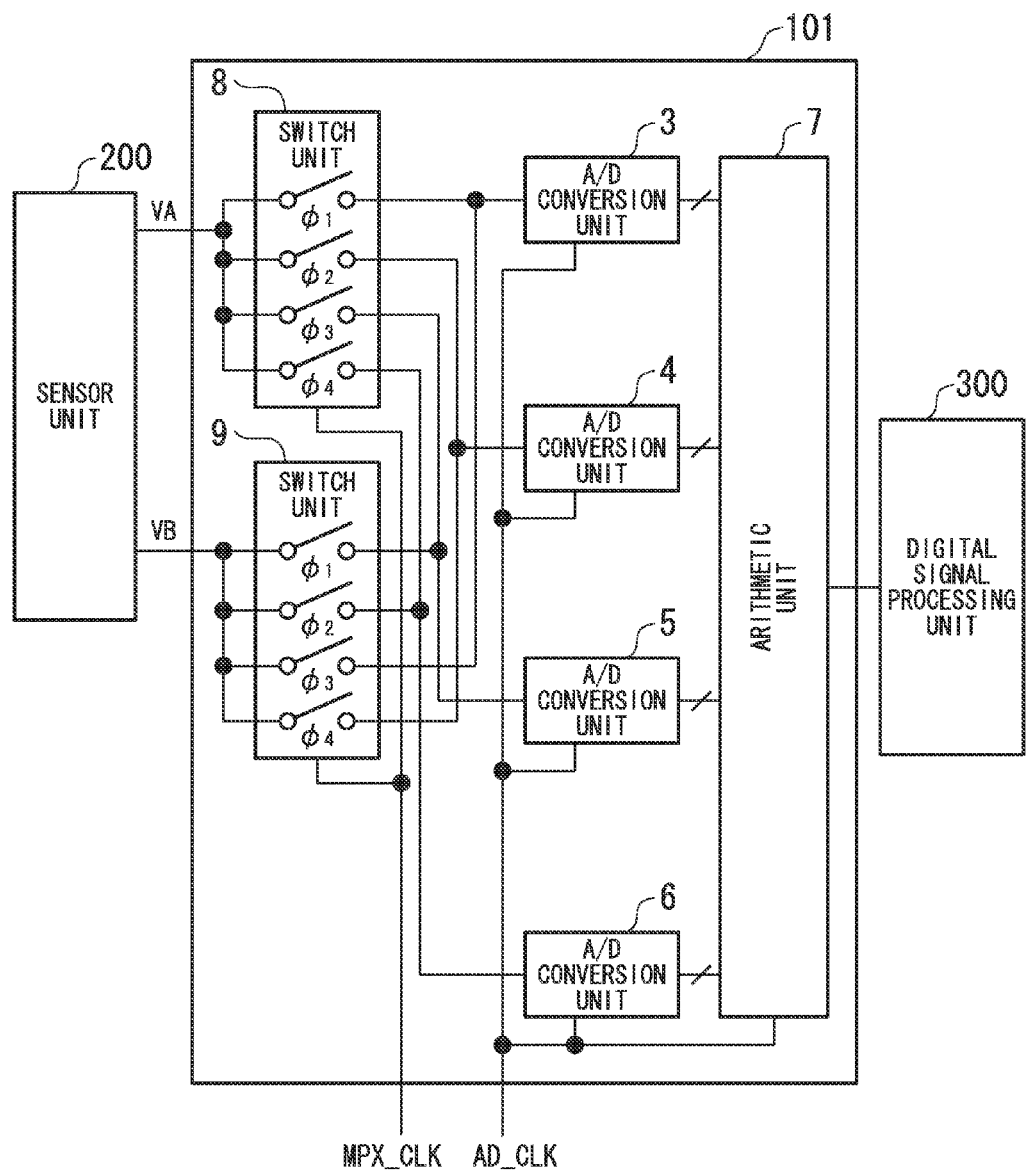
FIG. 4 is a block diagram illustrating a configuration of a signal processing circuit including an A/D conversion circuit in accordance with the second preferred embodiment of the present invention.

Next, the second preferred embodiment of the present invention will be described. FIG. 4 is a block diagram illustrating a configuration of a signal processing circuit including an A/D conversion circuit in accordance with the second preferred embodiment of the present invention. The signal processing circuit shown in FIG. 4 includes an A/D conversion circuit 101, a sensor unit 200, and a digital signal processing unit 300. The A/D conversion circuit 101 includes switch units 8 and 9, A/D conversion units 3, 4, 5, and 6, and an arithmetic unit 7. In FIG. 4, the same configurations as those of FIG. 1 are denoted by the same reference numerals. The configurations of the A/D conversion units 3, 4, 5, and 6 are the same as shown in FIG. 2.

A plurality of analog signals (VA and VB signals) output from the sensor unit 200 are input to the switch units 8 and 9. Based on a control signal MPX_CLK, the switch units 8 and 9 alternately switch output destinations of the VA and VB signals input in the same period to the A/D conversion units 3, 4, 5, and 6 in each sampling cycle of the A/D conversion units 3, 4, 5, and 6. The switch unit 8 switches the output destination of the VA signal, and the switch unit 9 switches the output destination of the VB signal.

The A/D conversion units 3, 4, 5, and 6 A/D-convert the VA and VB signals output from the switch units 8 and 9 based on a control signal AD_CLK, and generate digital signals. The arithmetic unit 7 performs an arithmetic operation on the digital signals output from the A/D conversion units 3, 4, 5, and 6 based on the control signal AD_CLK, and outputs an arithmetic operation result to the subsequent-stage digital signal processing unit 300. More specifically, the arithmetic unit 7 performs a differential operation or a division operation between a result of addition of the digital signals output from the A/D conversion units 3, 4, 5, and 6 to which the VA signal is input and a result of addition of the digital signals output from the A/D conversion units 3, 4, 5, and 6 to which the VB signal is input. Details of the arithmetic operation performed by the arithmetic unit 7 will be described later.

First Operation Example

Figure 5:
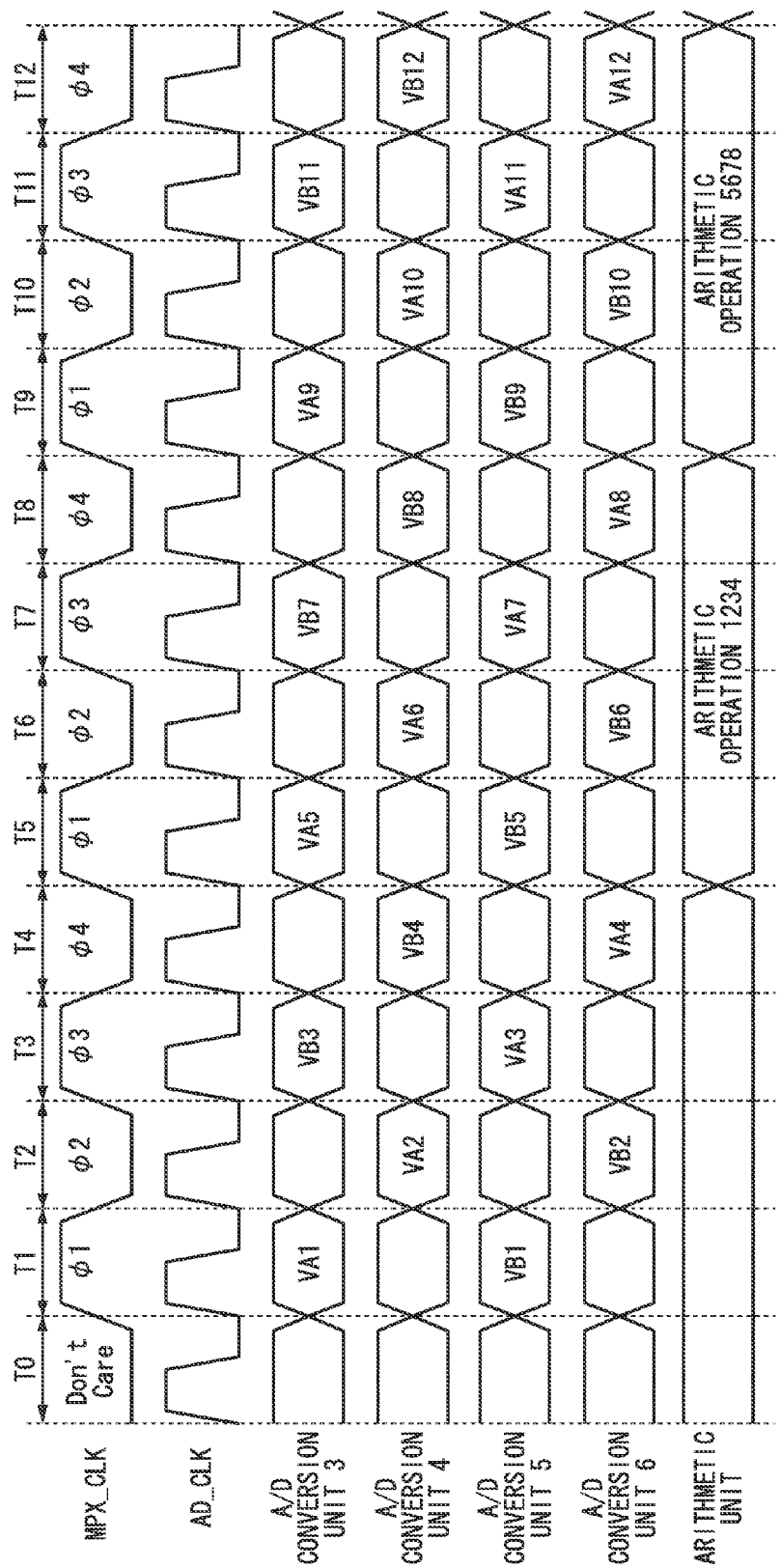
FIG. 5 is a timing chart illustrating an operation of the A/D conversion circuit 101 in accordance with the second preferred embodiment of the present invention.

Next, the first operation example (differential operation), which is a feature of the A/D conversion circuit 101 configured as described above, will be described in conjunction with a timing chart. FIG. 5 is a timing chart illustrating an operation of the A/D conversion circuit 101 in accordance with the second preferred embodiment of the present invention. Hereinafter, only parts different from the first operation example according to the first preferred embodiment will be described.

In the period T1, the switch unit 8 supplies the VA signal from the sensor unit 200 to the A/D conversion unit 3, and the switch unit 9 supplies the VB signal from the sensor unit 200 to the A/D conversion unit 5. In the period T2, the switch unit 8 supplies the VA signal from the sensor unit 200 to the A/D conversion unit 4, and the switch unit 9 supplies the VB signal from the sensor unit 200 to the A/D conversion unit 6.

In the period T3, the switch unit 9 supplies the VB signal from the sensor unit 200 to the A/D conversion unit 3, and the switch unit 8 supplies the VA signal from the sensor unit 200 to the A/D conversion unit 5. In the period T4, the switch unit 9 supplies the VB signal from the sensor unit 200 to the A/D conversion unit 4, and the switch unit 8 supplies the VA signal from the sensor unit 200 to the A/D conversion unit 6.

In the periods T5 to T8, the arithmetic unit 7 performs the following arithmetic operation of amplifying a difference signal between the VA and VB signals AD-converted during the periods T1 to T4 at any magnification ratio. Equation (9) indicates an arithmetic operation to be performed by the arithmetic unit 7, and Equation (10) is a modified equation of Equation (9).

$$V_{OUT1234} = \alpha[(VA1 + \text{Noise1} + \text{Error1}) + (VA2 + \text{Noise2} + \text{Error2})] + \quad (9)$$
$$\alpha[(VA3 + \text{Noise3} + \text{Error3}) + (VA4 + \text{Noise4} + \text{Error4})] -$$
$$\alpha[(VB1 + \text{Noise1} + \text{Error3}) + (VB2 + \text{Noise2} + \text{Error4})] -$$
$$\alpha[(VB3 + \text{Noise3} + \text{Error1}) + (VB4 + \text{Noise4} + \text{Error2})] + \beta$$

$$V_{OUT1234} \cong \quad (10)$$
$$\alpha[(VA1 + VA2 + VA3 + VA4) - (VB1 + VB2 + VB3 + VB4)] + \beta$$

The meanings of the symbols in Equations (9) and (10) are as follows.

$V_{OUT1234}$: Arithmetic operation result of the arithmetic unit 7 during the periods T1 to T4
VA1: VA signal of the sensor unit 200 in the period T1
VB1: VB signal of the sensor unit 200 in the period T1
VA2: VA signal of the sensor unit 200 in the period T2
VB2: VB signal of the sensor unit 200 in the period T2
VA3: VA signal of the sensor unit 200 in the period T3
VB3: VB signal of the sensor unit 200 in the period T3
VA4: VA signal of the sensor unit 200 in the period T4
VB4: VB signal of the sensor unit 200 in the period T4
α: Amplification factor
β: Reference signal to be added to the arithmetic operation result
Noise1: Noise component overlapping the sensor unit 200 in the period T1
Noise2: Noise component overlapping the sensor unit 200 in the period 12
Noise3: Noise component overlapping the sensor unit 200 in the period T3
Noise4: Noise component overlapping the sensor unit 200 in the period T4
Error1: A/D conversion error of the A/D conversion unit 3
Error2: A/D conversion error of the A/D conversion unit 4
Error3: A/D conversion error of the A/D conversion unit 5
Error4: A/D conversion error of the A/D conversion unit 6

It is possible to cancel the influence of the noise components overlapping the sensor unit 200 or the influence of the A/D conversion errors of the A/D conversion units 3, 4, 5, and 6 during the periods T1 to T4 from the above-described arithmetic operation result. The same is also true in an operation from the period T5.

Second Operation Example

Next, a difference from the first operation example will be described in the second operation example (division operation), which is a feature in the A/D conversion circuit 101 configured as described above. In the second operation example (division operation), an arithmetic operation in the periods T5 to T8 is as follows. Equation (11) indicates an arithmetic operation to be performed by the arithmetic unit 7, and Equation (12) is a modified equation of Equation (11).

$$V_{OUT1234} = [\alpha\{(VA1 + \text{Noise1} + \text{Error1}) + (VA2 + \text{Noise2} + \text{Error2})\} + \quad (11)$$
$$\alpha\{(VA3 + \text{Noise3} + \text{Error3}) + (VA4 + \text{Noise4} + \text{Error4})\} +$$
$$\beta] + [\alpha\{(VB1 + \text{Noise1} + \text{Error3}) + (VB2 + \text{Noise2} + \text{Error4})\} +$$
$$\alpha\{(VB3 + \text{Noise3} + \text{Error1}) + (VB4 + \text{Noise4} + \text{Error2})\} + \beta]$$

-continued
$$V_{OUT1234} = [\alpha\{(VA1 + VA2 + VA3 + VA4) + \quad (12)$$
$$(\text{Noise1} + \text{Noise2} + \text{Noise3} + \text{Noise4})\} +$$
$$\alpha\{(\text{Error1} + \text{Error2} + \text{Error3} + \text{Error4})\} +$$
$$\beta] + [\alpha\{(VB1 + VB2 + VB3 + VB4) +$$
$$(\text{Noise1} + \text{Noise2} + \text{Noise3} + \text{Noise4})\} +$$
$$\alpha\{(\text{Error1} + \text{Error2} + \text{Error3} + \text{Error4})\} + \beta]$$

The meanings of the symbols in Equations (11) and (12) are the same as those of the symbols in Equations (9) and (10).

As described above, a numerator of Equation (12) includes the signal components VA (VA1+VA2+VA3+VA4), the unnecessary noise components Noise1+Noise2+Noise3+Noise4 and Error1+Error2+Error3+Error4, and the reference signal β to be added. A denominator of Equation (12) includes the signal components VB (VB1+VB2+VB3+VB4), the unnecessary noise components Noise1+Noise2+Noise3+Noise4 and Error1+Error2+Error3+Error4, and the reference signal β to be added. That is, the unnecessary noise components and the reference signal to be added are identical.

Accordingly, a division operation result of Equation (12) generally becomes a relative variation between the signal component VA and the signal component VB, and comparative rate information between the signal component VA and the signal component VB in which the influence of the unnecessary noise component and the reference signal to be added is reduced can be obtained as an A/D conversion result. For example, it is possible to accurately obtain a relative variation of a sensor signal to a reference signal by designating the signal component VA as the sensor signal and designating the signal component VB as the reference signal.

According to this preferred embodiment as described above, the arithmetic unit 7 performs the differential operation or the division operation, thereby reducing the influence of noise components overlapping the VA and VB signals during the same period or the influence of A/D conversion errors due to individual differences of the A/D conversion units 3, 4, 5, and 6 and obtaining the same effect as in the first preferred embodiment.

While the two A/D conversion units are used in the first preferred embodiment, the four A/D conversion units are used in this preferred embodiment, and thus the number of A/D conversion units is greater than that of the first preferred embodiment. Thereby, it is possible to further reduce the influence of A/D conversion errors due to individual differences of the A/D conversion units than in the first preferred embodiment.

Third Preferred Embodiment

Figure 6:
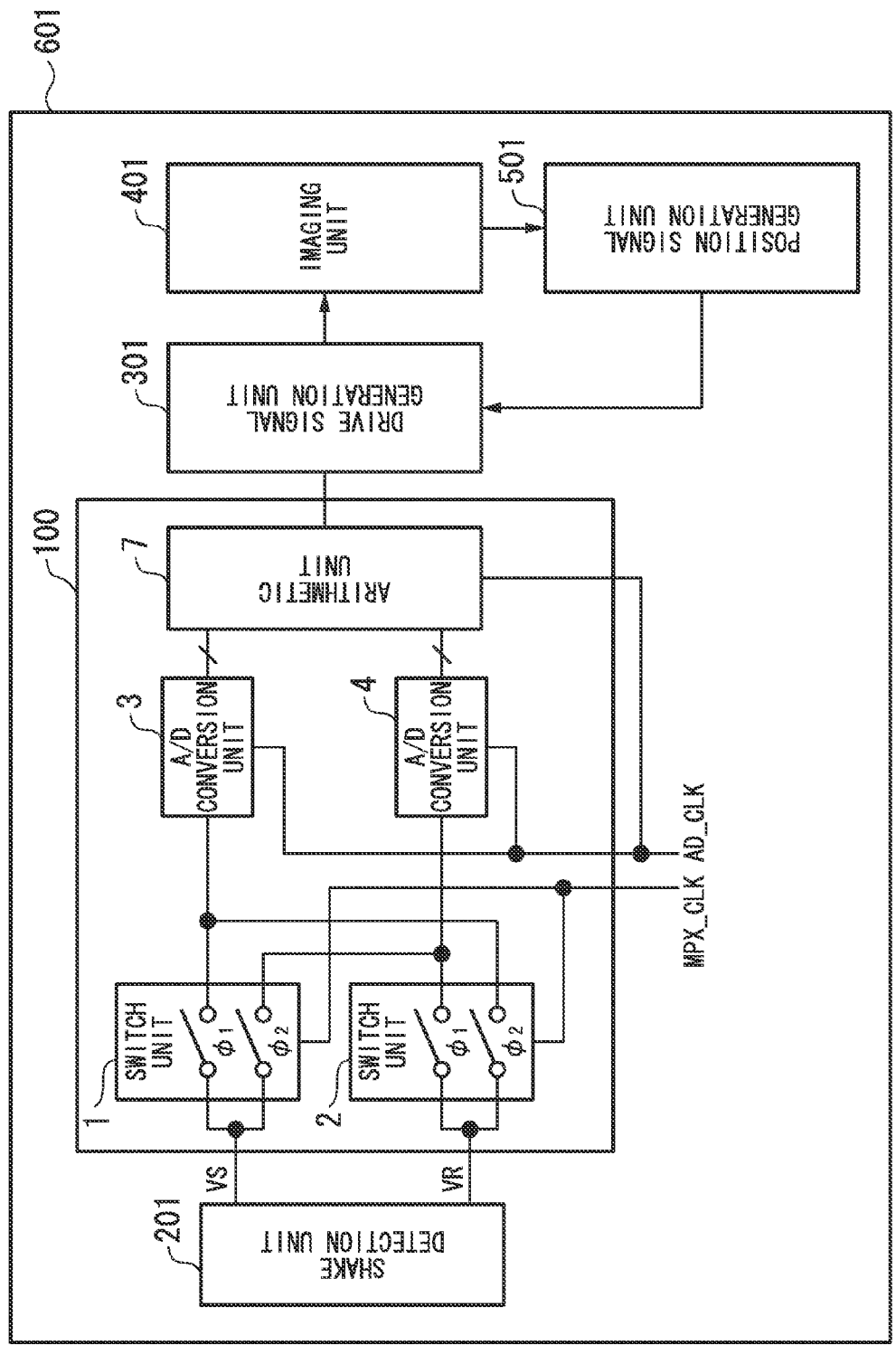
FIG. 6 is a block diagram illustrating a configuration of a shake detection device in accordance with the third preferred embodiment of the present invention.

Next, the third preferred embodiment of the present invention will be described. FIG. 6 is a block diagram illustrating a configuration of a shake detection device in accordance with the third preferred embodiment of the present invention. The shake detection device shown in FIG. 6 includes an A/D conversion circuit 100, a shake detection unit 201, a drive signal generation unit 301, an imaging unit 401, and a position signal generation unit 501. In FIG. 6, the same configurations as those of FIG. 1 are denoted by the same reference numerals.

The shake detection unit 201 includes, for example, an angular velocity sensor, an acceleration sensor, or the like, which converts a physical amount into an electrical signal, detects a shake amount of an imaging device having a shake detection device 601, and outputs a shake signal VS indicating the detected shake amount and its reference signal VR.

The drive signal generation unit 301 generates and outputs a drive signal for moving the imaging unit 401 based on a signal output from the A/D conversion circuit 100 and a signal output from the position signal generation unit 501. The imaging unit 401 includes an imaging element, a moving member for moving the image element, and the like. The position signal generation unit 501 detects a position where the imaging unit 401 is driven by the drive signal generation unit 301, and generates a signal indicating the detected position.

Next, an operation example, which is a feature of the shake detection device 601 configured as described above, will be described in conjunction with a timing chart. Because the timing chart indicating the operation example of the shake detection device 601 according to this preferred embodiment is the same as that of FIG. 3, description thereof will be given with reference to FIG. 3. In the operation of this preferred embodiment, the VA signal of FIG. 3 is replaced with the shake signal VS, and the VB signal is replaced with the reference signal VR.

When a period T0 is reached after a power supply of an imaging device is started, a first-stage release switch of the imaging device is set. At this time, a pulse signal StartP supplied to A/D conversion units 3 and 4 varies from an "L" level to an "H" level, and circulates within a NAND circuit (NAND) and a plurality of INVs configured in a ring shape. A counter 13 counts the number of circulations in which the pulse signal StartP varying with levels of signals Vin (17) supplied from switch units 1 and 2 and a cycle of a control signal AD_CLK circulates in the NAND and the INVs within a pulse transit circuit 11, and outputs the counted number of circulations as binary digital data. An encoder and latch 12 detects a position where the pulse signal StartP varying with the levels of the signals Vin (17) supplied from the switch units 1 and 2 and the cycle of the control signal AD_CLK circulates in the NAND and the INVs within the pulse transit circuit 11, and output the detected position as binary digital data.

A latch 14 latches the digital data output from the counter 13. A latch 15 generates binary digital data corresponding to the signal levels supplied from the switch units 1 and 2 in the cycle of the control signal AD_CLK by receiving the digital data from the latch 14 as higher bits and the digital data from the encoder and latch 12 as lower bits and adding the received digital data.

An arithmetic operator 16 calculates a difference between digital data after the latch operation of the latch 15 and digital data before the latch operation of the latch 15, and outputs the calculated difference to the subsequent-stage drive signal generation unit 301. Until the pulse signal StartP varies from the "H" level to the "L" level, the A/D conversion units 3 and 4 periodically output digital data corresponding to levels of the signals Vin (17) supplied from the switch units 1 and 2 in the cycle of the control signal AD_CLK.

When a period T1 is reached, a second-stage release switch of the imaging device is set. At this time, a control signal MPX_CLK has the "H" level, the switch unit 1 supplies the shake signal VS from the shake detection unit 201 to the A/D conversion unit 3, and the switch unit 2 supplies the reference signal VR from the shake detection unit 201 to the A/D conversion unit 4. The A/D conversion unit 3 A/D-converts the shake signal VS selected by the switch unit 1 based on the cycle set by the control signal AD_CLK. The A/D conversion unit 4 A/D-converts the reference signal VR selected by the switch unit 2 based on the cycle set by the control signal AD_CLK.

When a period T2 is reached, the control signal MPX_CLK has the "L" level, the switch unit 2 supplies the reference signal VR from the shake detection unit 201 to the A/D conversion unit 3, and the switch unit 1 supplies the shake signal VS from the shake detection unit 201 to the A/D conversion unit 4. The A/D conversion unit 3 A/D-converts the reference signal VR selected by the switch unit 2 based on the cycle set by the control signal AD_CLK. The A/D conversion unit 4 A/D-converts the shake signal VS selected by the switch unit 1 based on the cycle set by the control signal AD_CLK.

Here, one cycle of the control signal MPX_CLK in each period has substantially the same period as two cycles of the control signal AD_CLK unless otherwise noted.

When a period T3 is reached, as in the period T1, the control signal MPX_CLK has the "H" level, the switch unit 1 supplies the shake signal VS from the shake detection unit 201 to the A/D conversion unit 3, and the switch unit 2 supplies the reference signal VR from the shake detection unit 201 to the A/D conversion unit 4. The A/D conversion unit 3 A/D-converts the shake signal VS selected by the switch unit 1 based on the cycle set by the control signal AD_CLK. The A/D conversion unit 4 A/D-converts the reference signal VR selected by the switch unit 2 based on the cycle set by the control signal AD_CLK. Furthermore, the arithmetic unit 7 starts a predetermined arithmetic operation using results after the A/D conversion units 3 and 4 A/D-convert the shake signal VS and the reference signal VR during the periods T1 and T2.

When a period T4 is reached, as in the period T2, the control signal MPX_CLK has the "L" level, the switch unit 2 supplies the reference signal VR from the shake detection unit 201 to the A/D conversion unit 3, and the switch unit 1 supplies the shake signal VS from the shake detection unit 201 to the A/D conversion unit 4. The A/D conversion unit 3 A/D-converts the reference signal VR selected by the switch unit 2 based on the cycle set by the control signal AD_CLK. The A/D conversion unit 4 A/D-converts the shake signal VS selected by the switch unit 1 based on the cycle set by the control signal AD_CLK. Furthermore, the arithmetic unit 7 ends the predetermined arithmetic operation using the results after the A/D conversion units 3 and 4 A/D-convert the shake signal VS and the reference signal VR during the periods T1 and T2.

Here, the arithmetic unit 7 performs the following arithmetic operation to amplify a difference signal between the shake signal VS and the reference signal VR A/D-converted during the periods T1 and T2 at any magnification ratio. Equation (13) indicates an arithmetic operation to be performed by the arithmetic unit 7, and Equation (14) is a modified equation of Equation (13).

$$V_{OUT12} = \alpha[(VS1 + \text{Noise1} + \text{Error1}) + (VS2 + \text{Noise2} + \text{Error2})] - \alpha[(VR1 + \text{Noise1} + \text{Error2}) + (VR2 + \text{Noise2} + \text{Error1})] + \beta \quad (13)$$

$$V_{OUT12} \cong \alpha[(VS1 + VS2) - (VR1 + VR2)] + \beta \quad (14)$$

The meanings of the symbols in Equations (13) and (14) are as follows.

$V_{OUT12}$: Arithmetic operation result of the arithmetic unit 7 during the periods T1 and T2

VS1: Shake signal of the shake detection unit 201 in the period T1

VR1: Reference signal of the shake detection unit 201 in the period T1

VS2: Shake signal of the shake detection unit 201 in the period T2

VR2: Reference signal of the shake detection unit 201 in the period T2

α: Amplification factor

β: Reference signal to be added to the arithmetic operation result

Noise1: Noise component overlapping the shake detection unit 201 in the period T1

Noise2: Noise component overlapping the shake detection unit 201 in the period T2

Error1: A/D conversion error of the A/D conversion unit 3

Error2: A/D conversion error of the A/D conversion unit 4

It is possible to cancel the influence of the noise components overlapping the shake detection unit 201 or the influence of the A/D conversion errors of the A/D conversion units 3 and 4 during the periods T1 and T2 from the above-described arithmetic operation result.

Based on the signal output from the A/D conversion circuit 100 (Equation (14)), the drive signal generation unit 301 moves the imaging unit 401 in a direction in which a camera shake occurring in the image device is corrected, that is, within a plane perpendicular to an optical axis from a subject image. The position signal generation unit 501 detects a position where the imaging unit 401 has moved and outputs a signal corresponding to the position to the drive signal generation unit 301. The drive signal generation unit 301 moves the imaging unit 401 within the plane perpendicular to the optical axis from the subject image so that a deviation does not occur between the signal output from the A/D conversion circuit 100 and the signal output from the position signal generation unit 501.

When a period 15 is reached, as in the periods T1 and T3, the control signal MPX_CLK has the "H" level, the switch unit 1 supplies the shake signal VS from the shake detection unit 201 to the A/D conversion unit 3, and the switch unit 2 supplies the reference signal VR from the shake detection unit 201 to the A/D conversion unit 4. The A/D conversion unit 3 A/D-converts the shake signal VS selected by the switch unit 1 based on the cycle set by the control signal AD_CLK. The A/D conversion unit 4 A/D-converts the reference signal VR selected by the switch unit 2 based on the cycle set by the control signal AD_CLK. Furthermore, the arithmetic unit 7 starts a predetermined arithmetic operation using results after the A/D conversion units 3 and 4 A/D-convert the shake signal VS and the reference signal VR during the periods T3 and T4.

When a period T6 is reached, as in the periods T2 and T4, the control signal MPX_CLK has the "L" level, the switch unit 2 supplies the reference signal VR from the shake detection unit 201 to the A/D conversion unit 3, and the switch unit 1 supplies the shake signal VS from the shake detection unit 201 to the A/D conversion unit 4. The A/D conversion unit 3 A/D-converts the reference signal VR selected by the switch unit 2 based on the cycle set by the control signal AD_CLK. The A/D conversion unit 4 A/D-converts the shake signal VS selected by the switch unit 1 based on the cycle set by the control signal AD_CLK. Furthermore, the arithmetic unit 7 ends the predetermined arithmetic operation using the results after the A/D conversion units 3 and 4 A/D-convert the shake signal VS and the reference signal VR during the periods T3 and T4.

Here, the arithmetic unit 7 performs the following arithmetic operation to amplify a difference signal between the shake signal VS and the reference signal VR A/D-converted during the periods T1 and T2 at any magnification ratio. Equation (15) indicates an arithmetic operation to be performed by the arithmetic unit 7, and Equation (16) is a modified equation of Equation (15).

$$V_{OUT34} = \alpha[(VS3 + \text{Noise3} + \text{Error3}) + (VS4 + \text{Noise4} + \text{Error4})] - \alpha[(VR3 + \text{Noise3} + \text{Error4}) + (VR4 + \text{Noise4} + \text{Error3})] + \beta \quad (15)$$

$$V_{OUT34} \cong \alpha[(VS3 + VS4) - (VR3 + VR4)] + \beta \quad (16)$$

The meanings of the symbols in Equations (15) and (16) are as follows.

$V_{OUT34}$: Arithmetic operation result of the arithmetic unit 7 during the periods T3 and T4

VS3: Shake signal of the shake detection unit 201 in the period T3

VR3: Reference signal of the shake detection unit 201 in the period T3

VS4: Shake signal of the shake detection unit 201 in the period T4

VR4: Reference signal of the shake detection unit 201 in the period T4

α: Amplification factor

β: Reference signal to be added to the arithmetic operation result

Noise3: Noise component overlapping the shake detection unit 201 in the period T3

Noise4: Noise component overlapping the shake detection unit 201 in the period T4

Error3: A/D conversion error of the A/D conversion unit 3

Error4: A/D conversion error of the A/D conversion unit 4

It is possible to cancel the influence of the noise components overlapping the shake detection unit 201 or the influence of the A/D conversion errors of the A/D conversion units 3 and 4 during the periods T3 and T4 from the above-described arithmetic operation result.

Based on the signal output from the A/D conversion circuit 100 (Equation (16)), the drive signal generation unit 301 moves the imaging unit 401 in a direction in which a camera shake occurring in the image device is corrected, that is, within the plane perpendicular to the optical axis from the subject image. The position signal generation unit 501 detects a position where the imaging unit 401 has moved and outputs a signal corresponding to the position to the drive signal generation unit 301. The drive signal generation unit 301 moves the imaging unit 401 within the plane perpendicular to the optical axis from the subject image so that a deviation does not occur between the signal output from the A/D conversion circuit 100 and the signal output from the position signal generation unit 501.

Because the same operation from a period T7 as in the periods T3 and T4 or the periods T5 and T6 is iterated until the power supply of the imaging device is stopped and the pulse signal StartP supplied to the A/D conversion units 3 and 4 varies from the "H" level to the "L" level, description thereof is omitted.

According to this preferred embodiment as described above, the arithmetic unit 7 performs the differential operation, thereby reducing the influence of noise components overlapping the shake signal VS and the reference signal VR during the same period or the influence of A/D conversion errors due to individual differences of the A/D conversion units 3 and 4. Accordingly, it is possible to improve an A/D conversion accuracy when the shake signal VS and the reference signal VR having a correlation are converted into digital signals.

Because it is possible to accurately detect a shake signal from the shake detection unit 201, the drive signal generation unit 301 can control a feedback to minimize a deviation between signals output from the A/D conversion circuit 100 and the position signal generation unit 501, so that a camera shake occurring in the imaging device can be accurately corrected.

Figure 7:
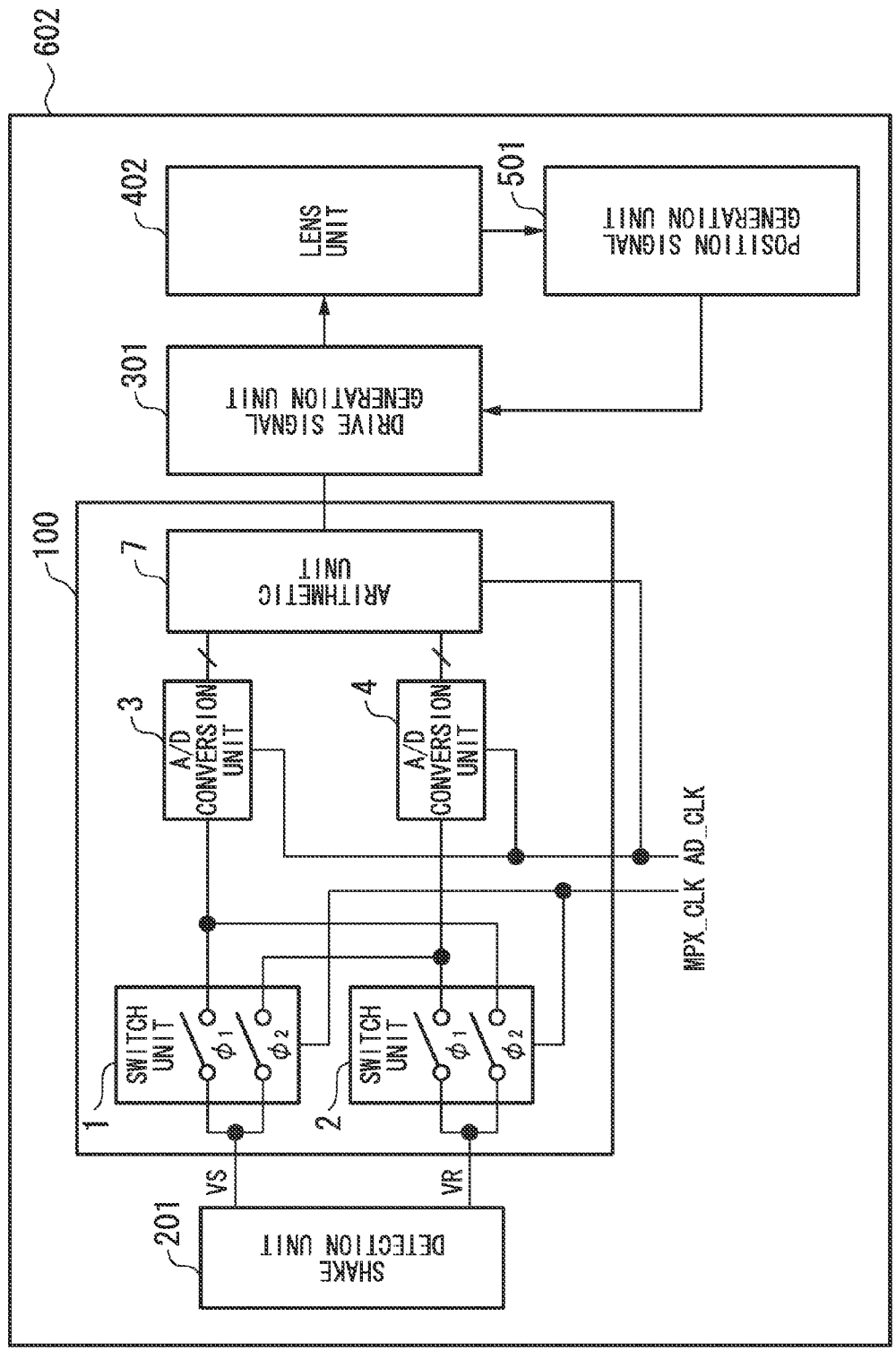
FIG. 7 is a block diagram illustrating a configuration of the shake detection device 602 in accordance with the third preferred embodiment of the present invention.

Although the case where a control target of the drive signal generation unit 301 is limited to the imaging unit has been described in this preferred embodiment, the same effect as described above can be obtained even when the lens unit 402 including a lens and a moving member for moving the lens (not shown) and the like is a control target of the drive signal generation unit 301 in the shake detection device 602 as shown in FIG. 7. FIG. 7 is a block diagram illustrating a configuration of the shake detection device 602 in accordance with the third preferred embodiment of the present invention.

Although an angular velocity sensor for detecting a shake of the imaging device is used as an example of the sensor in this preferred embodiment; the same effect as described above can be obtained, for example, as long as it is a sensor capable of alternately outputting a plurality of analog signals having low output signal amplitudes and a correlation to A/D conversion units in each sampling cycle, without being particularly limited. Although the case where the arithmetic unit 7 performs a differential operation has been described in this preferred embodiment, the arithmetic unit 7 may perform a division operation.

While preferred embodiments of the invention have been described and illustrated above, it should be understood that these are exemplary of the invention and are not to be considered as limiting. Additions, omissions, substitutions, and other modifications can be made without departing from the scope of the present invention.

For example, the present invention can provide a pressure sensor apparatus, which accurately A/D-converts a plurality of analog signals having a correlation.

What is claimed is:

1. An analog-to-digital (A/D) conversion circuit that receives a plurality of analog signals and outputs digital signals corresponding to the analog signals, the A/D conversion circuit comprising:
   a plurality of A/D conversion units each of which converts input analog signals into digital signals;
   a switch unit that receives a first analog signal and a second analog signal among the plurality of analog signals, the switch unit alternately switching output destinations of the first analog signal and the second analog signal input in the same period to the plurality of A/D conversion units in each sampling cycle of the plurality of A/D conversion units; and
   an arithmetic unit that performs a differential operation between a result of addition of the digital signals output from the plurality of A/D conversion units to which the first analog signal is input and a result of addition of the digital signals output from the plurality of A/D conversion units to which the second analog signal is input, the arithmetic unit outputting a third digital signal corresponding to a result of the differential operation.

2. The A/D conversion circuit according to claim 1, wherein the first analog signal and the second analog signal are output from the same sensor.

3. The A/D conversion circuit according to claim 1, wherein the number of the plurality of A/D conversion units is greater than the number of the plurality of analog signals.

4. The A/D conversion circuit according to claim 1, wherein the A/D conversion unit comprises:
   a pulse transit circuit in which a plurality of delay units are connected in series to delay an input pulse signal by a delay time corresponding to the analog signals and output the delayed pulse signal; and
   a latch circuit that latches an output signal from each delay unit constituting the pulse transit circuit at a predetermined timing after the pulse signal is input into the pulse transit circuit, the latch circuit generating the digital signals indicating an arrival position of the pulse signal within the pulse transit circuit based on a level of each output signal that has been latched.

5. A signal processing circuit comprising:
   a sensor unit that detects physical amounts and outputs a plurality of analog signals indicating the detected physical amounts;
   the A/D conversion circuit according to claim 1 to which the plurality of analog signals output from the sensor unit are input; and
   a digital signal processing unit that performs predetermined signal processing based on the digital signal output from the A/D conversion circuit.

6. A shake detection device comprising:
   a shake detection unit that detects a shake of an imaging device and outputs a plurality of analog signals including a signal indicating an amount of the detected shake;
   the A/D conversion circuit according to claim 1 to which the plurality of analog signals output from the shake detection unit are input;
   a position signal generation unit that generates a position signal indicating a position where an imaging unit or a lens unit in the imaging device is driven; and
   a drive signal generation unit that generates a signal for driving the imaging unit or the lens unit based on a deviation between the digital signal output from the A/D conversion circuit and the position signal output from the position signal generation unit.

7. An analog-to-digital (A/D) conversion circuit that receives a plurality of analog signals and outputs digital signals corresponding to the analog signals, the A/D conversion circuit comprising:
   a plurality of A/D conversion units each of which converts input analog signals into digital signals;
   a switch unit that receives a first analog signal and a second analog signal among the plurality of analog signals, the switch unit alternately switching output destinations of the first analog signal and the second analog signal input in the same period to the plurality of A/D conversion units in each sampling cycle of the plurality of A/D conversion units; and
   an arithmetic unit that performs a division operation between a result of addition of the digital signals output from the plurality of A/D conversion units to which the first analog signal is input and a result of addition of the digital signals output from the plurality of A/D conversion units to which the second analog signal is input, the arithmetic unit outputting a third digital signal corresponding to a result of the division operation.

8. The A/D conversion circuit according to claim 7, wherein the first analog signal and the second analog signal are output from the same sensor.

9. The A/D conversion circuit according to claim 7, wherein the number of the plurality of A/D conversion units is greater than the number of the plurality of analog signals.

10. The A/D conversion circuit according to claim 7, wherein the A/D conversion unit comprises:
    a pulse transit circuit in which a plurality of delay units are connected in series to delay an input pulse signal by a delay time corresponding to the analog signals and output the delayed pulse signal; and a latch circuit that latches an output signal from each delay unit constituting the pulse transit circuit at a predetermined timing after the pulse signal is input into the pulse transit circuit, the latch circuit generating the digital signals indicating an arrival position of the pulse signal within the pulse transit circuit based on a level of each output signal that has been latched.

* * * * *